United States Patent
Sung et al.

(10) Patent No.: US 6,347,990 B1
(45) Date of Patent: Feb. 19, 2002

(54) MICROELECTRONIC FABRICATION SYSTEM CLEANING METHODS AND SYSTEMS THAT MAINTAIN HIGHER AIR PRESSURE IN A PROCESS AREA THAN IN A TRANSFER AREA

(75) Inventors: Woo-dong Sung; Sam-soon Han; Chang-wook Oh; Kang-sik Lee, all of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/338,712

(22) Filed: Jun. 23, 1999

(30) Foreign Application Priority Data

Apr. 3, 1999 (KR) .............................. 99-11734

(51) Int. Cl.[7] ................................ F24F 7/10
(52) U.S. Cl. .................. 454/187; 414/217; 414/940
(58) Field of Search .................. 454/187; 414/217, 414/222.01, 937, 940

(56) References Cited

U.S. PATENT DOCUMENTS

| 4,676,144 A | * | 6/1987 | Smith, III | 454/187 |
| 4,963,069 A | * | 10/1990 | Wurst et al. | 454/187 X |
| 5,876,280 A | * | 3/1999 | Kitano et al. | 454/187 |
| 5,928,390 A | * | 7/1999 | Yaegashi et al. | |
| 6,074,154 A | * | 6/2000 | Ueda et al. | 414/217 |
| 6,146,266 A | * | 11/2000 | O'Halloran et al. | 454/187 |

FOREIGN PATENT DOCUMENTS

| JP | 62-147249 A | * | 7/1987 | 454/187 |
| JP | 10247677 | | 9/1998 | |

* cited by examiner

Primary Examiner—Harold Joyce
(74) Attorney, Agent, or Firm—Myers Bigel Sibley & Sajovec

(57) ABSTRACT

A microelectronic fabrication system that includes a service area, a process area in the service area where microelectronic devices are processed, and a transfer area in the service area where microelectronic devices are transferred to and from the process area, is cleaned by maintaining higher pressure in the process area than in the transfer area, to thereby reduce particle flow from the transfer area to the process area. It has been found that conventional microelectronic fabrication system cleaning methods and systems can allow air to flow backward to the wafer process area. By allowing backward flow of air to the wafer process area, air may be induced from a place where a lower degree of cleanliness is maintained to a place where a higher degree of cleanliness should be maintained. Due to the backward flow of air, particles contained in the transfer area, that may be generated by the transfer system, may flow onto the wafer that is being processed in the process area. In sharp contrast, by maintaining higher air pressure in the process area than in the transfer area, particle flow from the transfer area to the process area can be reduced and preferably can be eliminated.

71 Claims, 13 Drawing Sheets

MICROELECTRONIC FABRICATION SYSTEM CLEANING METHODS AND SYSTEMS THAT MAINTAIN HIGHER AIR PRESSURE IN A PROCESS AREA THAN IN A TRANSFER AREA

FIELD OF THE INVENTION

This invention relates to microelectronic fabrication systems, and more particularly to methods and systems for cleaning microelectronic fabrication systems.

BACKGROUND OF THE INVENTION

Microelectronic fabrication systems are widely used to fabricate microelectronic devices such as microelectronic wafers, integrated circuits and liquid crystal display panels. Tile environment of a microelectronic fabrication process generally must be maintained in a very clean state, in order to allow high yields of microelectronic devices. In general, as microelectronic devices become more highly integrated, a higher degree of cleanness may be required.

A unit process region where a specific process is performed on a microelectronic substrate such as a wafer, generally includes a wafer process area where a predetermined operation is performed on the wafer and a wafer transfer area where the wafer is loaded/unloaded to/from the wafer process area. The unit process region is located in a service area of the microelectronic fabrication system The unit process region generally adjoins a working area which is also referred to as a bay. After a boat having wafers mounted thereon is moved from the working area to the wafer transfer area by an operator, a robot in the wafer transfer area loads wafers one by one from the boat to the wafer process area. The robot in the water transfer area also performs an unloading operation of wafers from the wafer process area, after processing has been performed.

FIGS. 1 and 2 are a top view and a side view of a layout of a conventional microelectronic fabrication system.

In FIGS. 1 and 2, reference numeral 1 denotes a clean room that is isolated from the outside environment and that includes a working area 10 and a service area 20. In the clean room 1, the temperature and the humidity are controlled and particle-removed clean air flows downward.

An upper plenum 2 for supplying clean air is placed in the upper portion of the clean room 1, and a lower plenum 3 for recovering the air that passes through the clean room 1 is placed in the lower portion thereof. The clean air supplied from the upper plenum 2 passes through the working area 10 and the service area 20 via a filter. Fine particles generated in the working area 10 and in the service area 20 are exhausted through the lower plenum 3 that is maintained at a low pressure, together with the clean air.

The clean room 1 is maintained at a pressure higher than the atmospheric pressure so that external air is not induced inside. Also, the pressure of the working area 10 is adjusted to be higher than that of the service area 20. This can prevent the fine particles generated in the service area 20 from being induced into the working area 10, due to the pressure difference. The pressure difference is controlled by adjusting the amount and/or velocity of clean air flowing through the working area 10 and the service area 20.

In FIG. 2, arrows indicate a direction of flow of the clean air. The upper and lower plenums 2 and 3 of the clean room 1 are isolated from each other by respective filters 2a for removing particles contained in the air and gratings 3a having openings through which the air passes. The amount of flow of the clean air in the working area 10 and the service area 20 may be adjusted by the sizes of the filters 2a, the number of gratings 3a and/or the number of openings formed in the gratings 3a.

As described above, since more air flows into the working area 10 than into the service area 20 and the working area 10 is maintained at a pressure higher than the service area 20, the air flows from the working area 10 to the service area 20. The air flow between the working area 10 and the service area 20 occurs via a wall 4 which isolates the working area 10 and the service area 20 from each other.

The wall 4 between the working area 10 and the service area 20 includes a plurality of members having gaps 4a large enough to allow the air to flow therethrough. Thus, some of the clean air flowing in the working area 10 of the clean room spontaneously flows to the service area 20 through the gaps 4a in the wall 4. The air flows between a wafer process area 31 where a predetermined process is performed on a wafer, and a wafer transfer area 32 where wafers are loaded/unloaded to/from the wafer process area 31.

An opening or a boat gate 4b for ingress or egress of a boat having a plurality of wafers mounted thereon is provided between the wafer transfer area 32 and the working area 10. An opening or a wafer gate 32a for ingress or egress of wafers is provided between the wafer process area 31 and the water transfer area 32. Doors for opening/closing the gates 4b and 32a are provided in the gates 4b and 32a. Gaps which allow a flow of air are present around the doors of the gates 4b and 32a.

According to the above-described structure, the air flows inside the process region 30. In particular, clean air is induced from the working area 10 maintained at a high pressure, to the wafer transfer area 32 through the gaps of the boat gate 4b or other openings present in the process region 30. The clean air induced into the wafer transfer area 32 penetrates to the wafer process area 31 through the wafer gate 32a. Then, the clean air induced to the wafer process area 31 is exhausted to the service area 20 through openings present around the wafer process area or a gap 31a. As described above, the flow of air inside the process region 30 occurs due to a pressure difference between the working area 10 and the service area 20.

As shown in FIG. 3, an air-supplying device 50 for supplying purified clean air to the wafer process area 31 and the wafer transfer area 32 may be installed in the process region 30.

Referring to FIG. 3, the air-supplying device 50 absorbs clean air from the working area 10 through an induction pipe 51, purifies the clean air physically and/or chemically and then supplies the purified clean air to the wafer process area 31 and the wafer transfer area 32 as shown by arrows 52 and 53 respectively. Alternatively, the air-supplying device 50 may be installed in the lower plenum 3 so that the air is induced therefrom, rather than from the working area 10. The flow of air supplied to the wafer process area 31 and the wafer transfer area 32 by the air-supplying device 50 is performed in a direction adapted to maintain the flow of air from the working area 10 at a higher pressure than the service area 20.

Thus, as described above with reference to FIG. 2, while purified clean air is supplied to the wafer process area 31 and the wafer transfer area 32 by the air-supplying device 50, the air also is induced from the working area 10 to the wafer transfer area 32 through the boat gate 4b. Then, air penetrates from the wafer transfer area 32 to the wafer process area 31 through the wafer gate 32a. Clean air induced to the wafer process area 31 is exhausted to the service area 20 through openings present around the wafer process area 31 or the gap 31a.

Notwithstanding these and other improvements in systems and methods for cleaning microelectronic fabrication systems, there continues to be a need for systems and methods for further improving the cleanliness of microelectronic fabrication systems.

SUMMARY OF THE INVENTION

It is therefore an object of the present invention to provide methods and systems for cleaning microelectronic fabrication systems.

It is another object of the present invention to provide microelectronic system cleaning methods and systems that can reduce contamination of microelectronic devices.

It is another object of the present invention to provide microelectronic fabrication system cleaning methods and systems that can improve the yield of microelectronic devices.

These and other objects are provided, according to the present invention, by cleaning a microelectronic fabrication system that includes a service area, a process area in the service area where microelectronic devices are processed, and a transfer area in the service area where microelectronic devices are transferred to and from the process area, by maintaining higher pressure in the process area than in the transfer area, to thereby reduce particle flow from the transfer area to the process area. It has been found, according to the present invention, that conventional microelectronic fabrication system cleaning methods and systems can allow air to flow backward to the wafer process area. By allowing backward flow of air to the wafer process area, air may be induced from a place where a lower degree of cleanliness is maintained to a place where a higher degree of cleanliness should be maintained. Due to the backward flow of air, particles contained in the transfer area, that may be generated by the transfer system, may flow onto the wafer that is being processed in the process area. In sharp contrast, by maintaining higher air pressure in the process area than in the transfer area, the present invention can reduce and preferably eliminate particle flow from the transfer area to the process area.

According to other aspects of the present invention, the microelectronic fabrication system further includes a working area that is coupled to the service area and wherein the transfer area is also coupled to the working area. Higher air pressure may be maintained in the transfer area than in the working area, to thereby enhance particle flow from the transfer area to the working area. Moreover, higher air pressure may be maintained in the process area than in the service area outside the process area, to thereby enhance particle flow from the process area to the service area outside the processor. Air flow also may be induced from the working area into the transfer area and into the process area, to maintain higher air pressure in the process area than in the transfer area. Air also may be exhausted from the transfer area to the working area, to thereby enhance particle flow from the transfer area to the working area. Air also may be exhausted from the transfer area to the lower plenum, to thereby enhance particle flow from the transfer area. Improved systems and methods for cleaning microelectronic fabrication systems thereby may be provided.

DETAILED DESCRIPTION OF PREFERRED EMBODIMENTS

Figure 1:
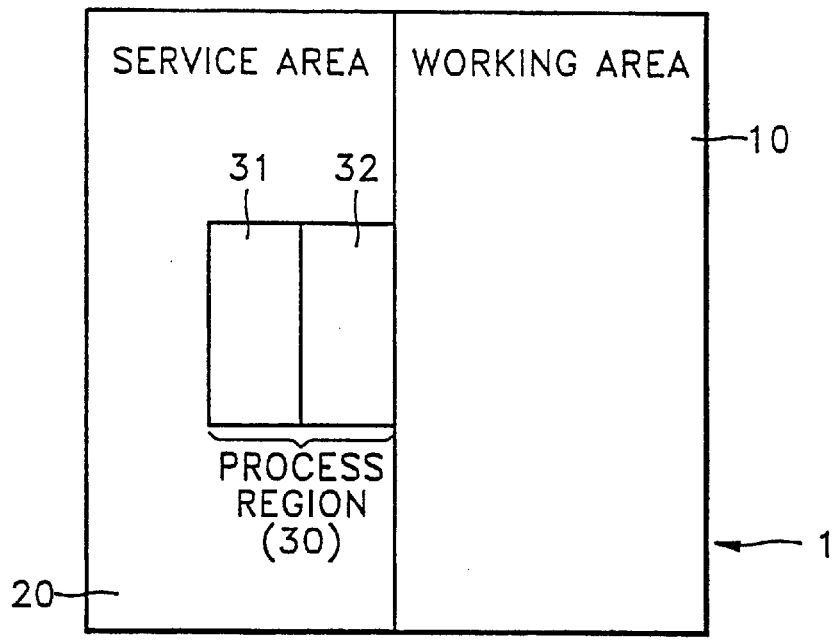
FIG. 1 is a top view of a layout of a conventional microelectronic fabrication system.
Figure 2:
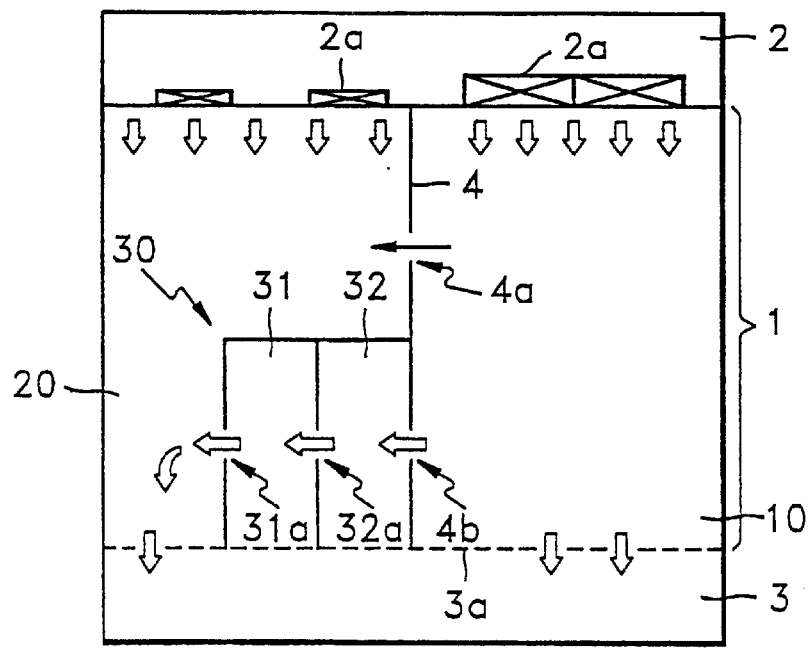
FIG. 2 is a side view of a layout of a conventional microelectronic fabrication system.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the dimensions of regions may be exaggerated for clarity. Like numbers refer to like elements throughout. It will be understood that when an element is referred to as being "on" another element, it can be directly on the other element or intervening elements may also be present. In contrast, when an element is referred to as being "directly on" another element, there are no intervening elements present.

Prior to describing the present invention, undesired backward air flow in conventional semiconductor fabrication systems first will be described with reference to FIGS. 3 and 4.

Figure 3:
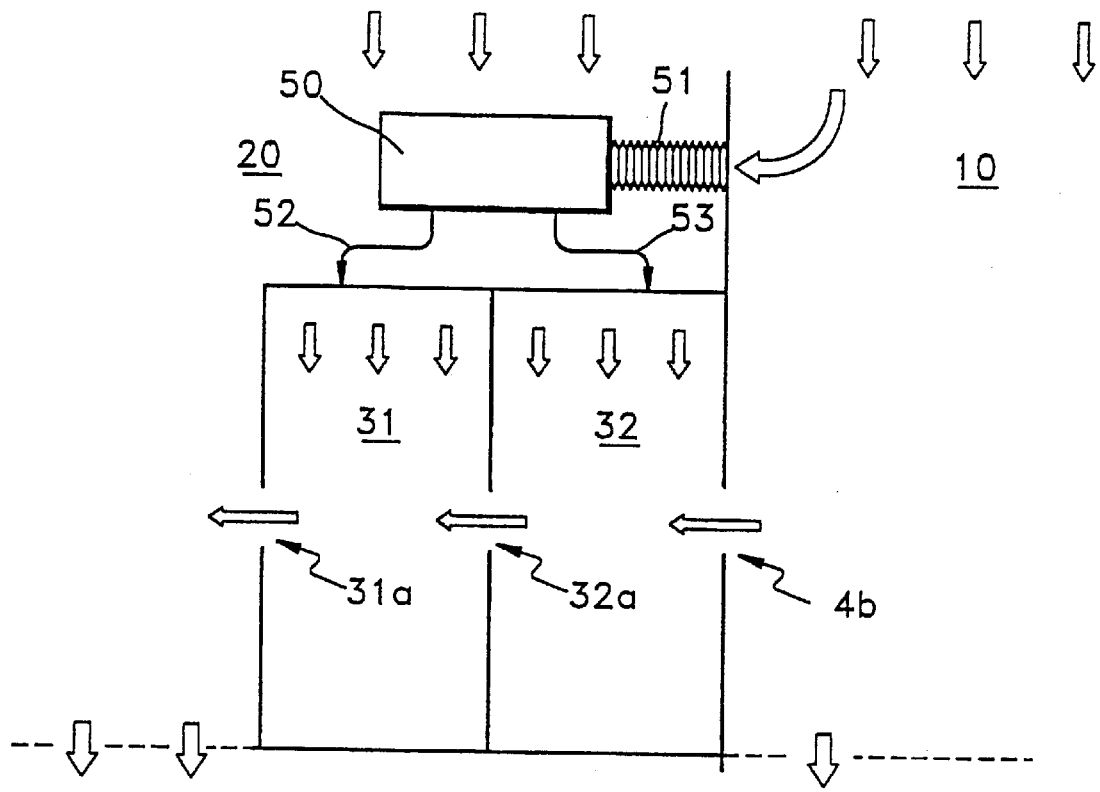
FIG. 3 illustrates the flow of clean air in a conventional microelectronic fabrication system.

In the air flow mechanism of FIG. 3, air having passed through the wafer transfer area 32 may flow backward to the wafer process area 31. As used herein, backward flow of air means that air is induced from a place where a lower degree of cleanness is maintained to another place where a higher degree of cleanness is desired. Thus, since the air flows from the wafer transfer area 32 to the wafer process area 31 where a high degree of cleanness is desired, this is an example of backward flow. Due to the backward flow of air, particles contained in the clean air having a lower degree of cleanness may be absorbed into a wafer on which a predetermined process is being conducted.

Figure 4:
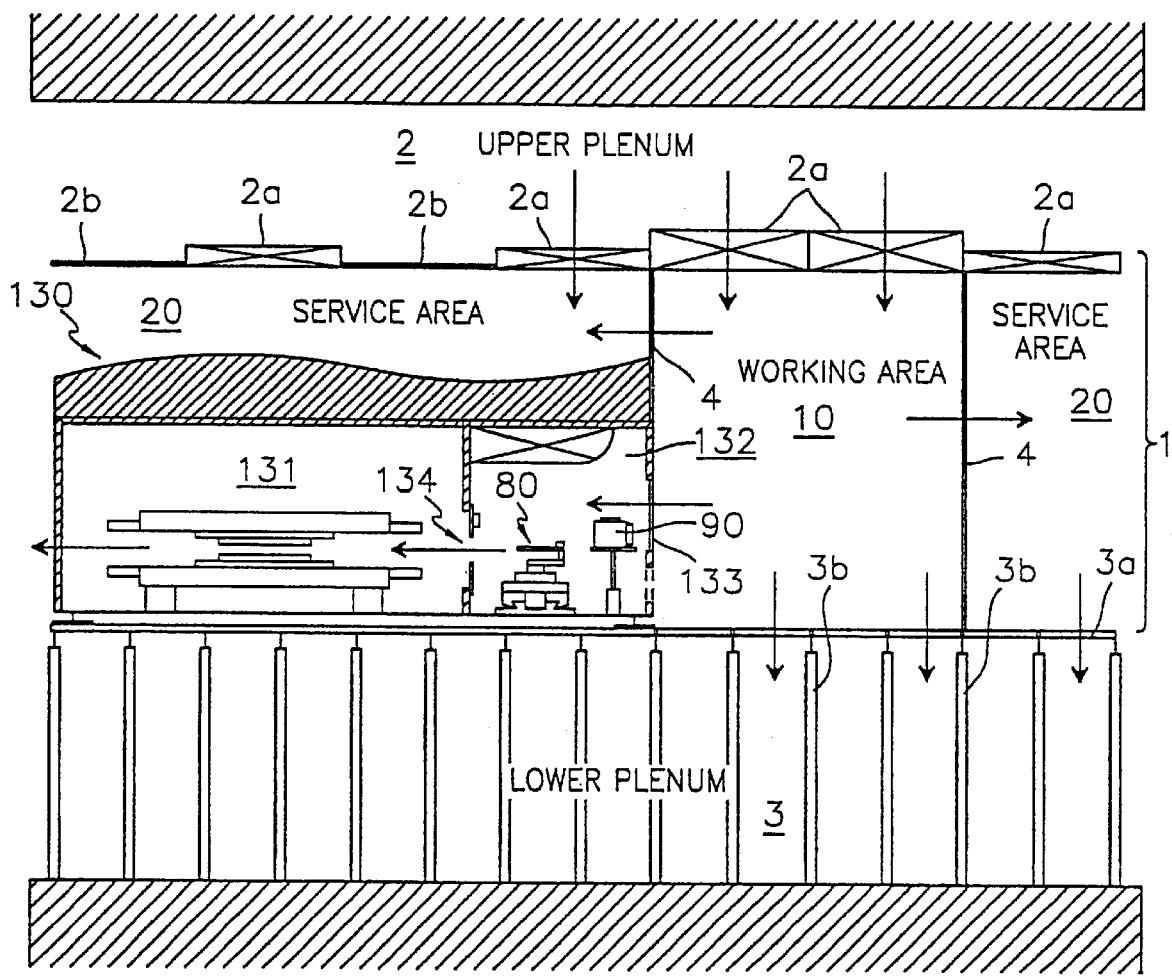
FIG. 4 is a schematic diagram illustrating a conventional exposure system having a clean air flow structure as shown in FIG. 3.

FIG. 4 shows a conventional microelectronic fabrication system, in which the above-described backward flow of air occurs. An upper plenum 2 and a lower plenum 3 are positioned in the upper and lower portions of a clean room 1 partitioned into a working area 10 and a service area 20 by walls 4, respectively. A blind panel 2b having air filters 2a is provided between the clean room 1 and the upper plenum 2. The air filter above the working area 10 is thicker than that above the service area 20 and is adjusted so as to induce a large amount of air. A grating 3a, corresponding to the floor of the clean room 1, is supported by pillars 3b installed in the lower plenum 3.

An exposure apparatus 130 includes a wafer process area 131 and a wafer transfer area 132. The wafer transfer area 132 adjoins the working area 10. A boat gate 133 through which a boat 90 having wafers mounted thereon passes, is positioned between the wafer transfer area 132 and the working area 10. A wafer gate 134 through which wafers pass, is positioned between the wafer transfer area 132 and the wafer process area 131. A robot 80, which unloads a wafer from the boat 90 and loads the wafer into the wafer process area 131 through the wafer gate 134, is installed in the wafer transfer area 132. The robot 80 performs a wafer loading operation and an unloading operation to return the process-completed wafer to the boat 90. In the wafer process area 131, exposure using a mask or reticle is performed. The reticle is generally supplied from a reticle stage (not shown) provided in the upper portion of the wafer process area 131. An air-supplying device (not shown) for supplying purified air to the wafer transfer area 132 and the wafer process area 131 is separately provided in the exposure apparatus 130. The air-supplying device sucks clean air from the upper portion of the working area 10 close to the upper plenum 2, filters the sucked air physically and/or chemically and then supplies the filtered air to the wafer process area 131., the wafer transfer area 132 and the area of the reticle stage. This can prevent particles from accumulating in the respective areas by preventing the clean air from locally staying in the respective areas.

Arrows shown in FIG. 4 indicate flow directions of the clean air in the clean room 1. Some of the clean air from the working area 10 is induced to the wafer process area 131 through the wafer transfer area 132. The clean air in the wafer process area 131 flows to the service area 20 through gaps or openings present around the wafer process area 131. Air also is directly supplied to the areas 131 and 132 by the air-supplying device.

In the wafer transfer area 132, there may be many particle generating sources. For example, the robot 80 has an arm for loading/unloading wafers. The arm of the robot 80 includes a plurality of dynamic elements for performing both vertical movement and horizontal movement. Friction between the dynamic elements of the arm of the robot 80 can produce many metal particles. The produced particles are induced into the wafer process area 131 along with the clean air and can attach to a wafer that is being exposed. The particles attached to the wafer can reduce the yield of products.

The problems caused by a backward flow of particles produced in a wafer transfer area may be encountered during other microelectronic fabrication processes in addition to the exposure process. As microelectronic devices become more highly integrated, the yield may be reduced.

Figure 5:
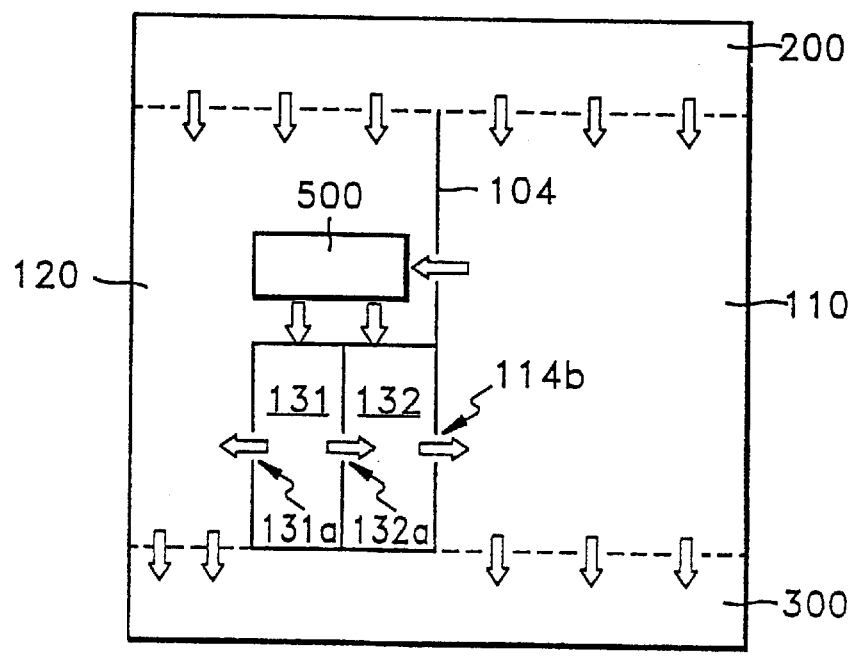
FIG. 5 illustrates a vertical structure of a microelectronic fabrication system according to a first embodiment of cleaning methods and systems according to the present invention.
Figure 6:
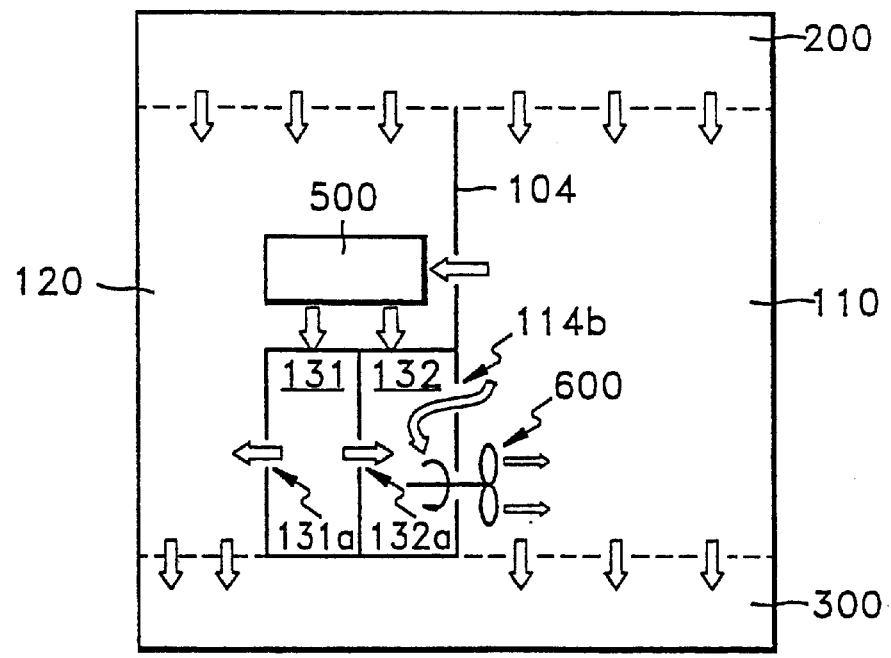
FIG. 6 illustrates a vertical structure of a microelectronic fabrication system according to a second embodiment of cleaning methods and systems according to the present invention.
Figure 7:
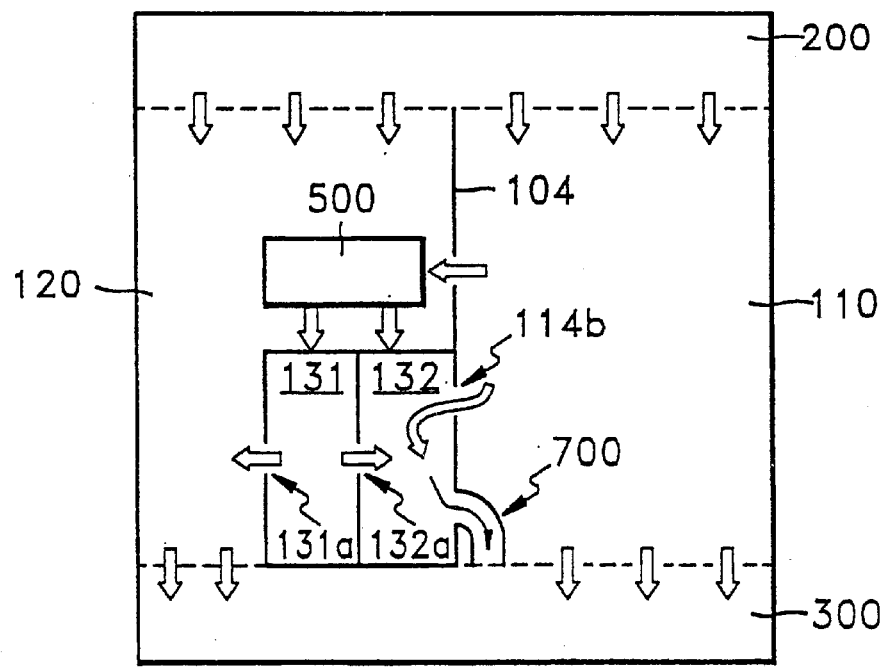
FIG. 7 illustrates a vertical structure of a microelectronic fabrication system according to a third embodiment of cleaning methods and systems according to the present invention.

FIGS. 5 through 7 illustrate a flow of clean air using an air handling system according to microelectronic fabrication system cleaning methods and systems of the present invention, in which arrows indicate clean air flow. Referring to FIG. 5, the primarily purified clean air supplied from an upper plenum 200 passes through a working area 110 and a service area 120 partitioned by a wall 104 and then reaches a lower plenum 300.

The clean air is supplied to the wafer process area 131 and the wafer transfer area 132 by an air-supplying device 500 for secondarily purifying the clean air from the working area 110. The amount of air supplied to the wafer process area 131 is larger than the amount of air supplied to the wafer transfer area 132. Thus, the wafer process area 131 is maintained at a higher pressure than the wafer transfer area 132. The pressure of the wafer transfer area 132 also is higher than that of the working area 110.

Thus, the clean air supplied to the wafer process area 131 flows to the service area 120 and to the wafer transfer area 132, and the air in the wafer transfer area 132 flows to the working area 110. The air-supplying device 500 sucks the clean air from the working area 110, purifies the same and then supplies the purified clean air to the wafer process area 131 and to the wafer transfer area 132. Alternatively, the air sucked by the air-supplying device 500 may be supplied from the lower plenum 300. Also, the air-supplying device 500 may be installed in the lower plenum 300. The number of elements or areas to which the air secondarily purified by the air-supplying device 500 flows, may increase based on the structure of the processing equipment that receives the air.

Air flow between the wafer transfer area 132 and the working area 110 can be induced through the boat gate 114b that is used for ingress or egress of a boat having a plurality of wafers mounted thereon, through openings present around a door installed in the boat gate 114b, through an air flow path provided separately from the boat gate 114b for the flow of air and/or using other techniques. The air flow between the wafer process area 131 and the wafer transfer area 132 can be induced through the wafer gate 132a that is used for ingress or egress of wafers, through openings present around a door installed in the wafer gate 132a, through openings provided separately from the wafer gate 132a for a flow of air and/or using other techniques. Also, the air flow from the wafer process area 131 to the service area 120 can be induced through gaps present around the wafer process area 131, through openings 131a provided for a flow of air and/or using other techniques.

In the aforementioned clean air flow structure, a very high degree of cleanness may be maintained in the wafer process area 131, compared to other areas. Since the secondarily purified clean air is supplied from the air-supplying device 500 to the wafer process area 131 and the wafer process area 131 is maintained at a higher pressure than the service area 120 and the wafer transfer area 132, the clean air preferably does not flow backward, i.e., from the service area 120 and the wafer transfer area 132 to the wafer process area 131. In particular, the particles produced within the wafer process area 131 may be exhausted to the service area 120 and to the wafer transfer area 132 due to the higher pressure of the wafer process area 131. Also, the air in the transfer area 132 in which a lot of particles may be produced by a robot may be directly exhausted to the working area 110.

FIG. 6 shows an air exhausting device 600 provided between the wafer transfer area 132 and the working area 110 shown in FIG. 5. The air-exhausting device 600 forcibly exhausts the air in the wafer transfer area 132 to the working area 110. The air exhausting device 600 may be employed in cases when the pressure difference between the wafer transfer area 132 and the working area 110 is not sufficiently large to exhaust the air in the wafer transfer area 132 to the working area 110 and when there is a possibility that a backward flow may occur. However, even in these cases, the pressure of the wafer process area 131 should be higher than that of the wafer transfer area 132.

The clean air supplied to the wafer process area 131 flows separately to the service area 120 and to the wafer transfer area 132, which are maintained at a relatively low pressure. The air in the wafer transfer area 132 is exhausted to the working area 110 by the air-exhausting device 600. The clean air induced from the working area 110 through the boat gate 114b or openings present around doors provided in the boat gate 114b is also exhausted to the working area 110 by the air exhausting device 600.

The air-supplying device 500 sucks air from the working area 110, purifies the same and then supplies the purified air to the wafer process area 131 and to the wafer transfer area 132. The air sucked by the air-supplying device 500 may be supplied from the lower plenum 300. Also, the air-supplying device 500 may be installed within the lower plenum 300. The number of elements or areas which supply the secondarily purified air may increase according to the structure of the processing equipment which receives the air. The air-supplying device 500 can also be utilized in other embodiments described below.

FIG. 7 shows another example of air exhausting from the wafer transfer area 132, in which an air exhausting path 700 directly connects the wafer transfer area 132 and the lower plenum 300. The lower plenum 300 recovers the air having passed through the working area 110 and the service area 120 and is maintained at a very low pressure. Thus, since the wafer transfer area 132 that is maintained at a lower pressure than the wafer process area 131 and at a considerably higher pressure than the lower plenum 300, is directly connected to the lower plenum 300, the air in the wafer transfer area 132 can flow quickly to the lower plenum 300. The air-exhausting path 700 may be provided by a pipe member, a panel member and/or other members.

The clean air supplied to the wafer process area 131 flows separately to each of the service area 120 and the wafer transfer area 132, which are maintained at a relatively low pressure. The air in the wafer transfer area 132 is exhausted to the lower plenum 300 by the air-exhausting path 700. The clean air induced to flow from the working area 110 through the boat gate 114b and/or openings present around doors provided in the boat gate 114b is also exhausted to the lower plenum 300 by the air exhausting path 700.

Figure 8:
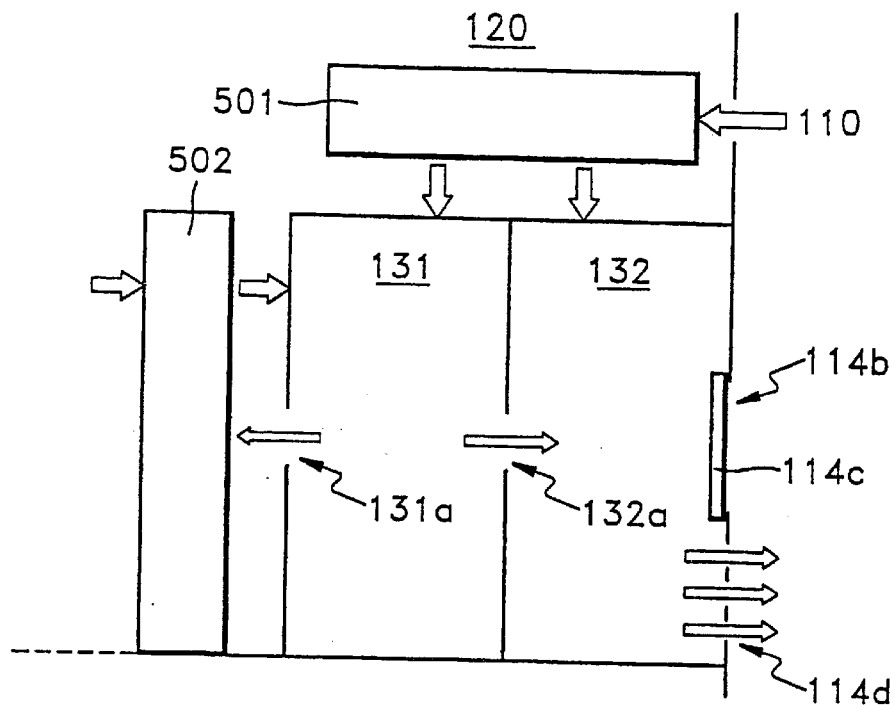
FIG. 8 illustrates a vertical structure of a microelectronic fabrication system according to a fourth embodiment of cleaning methods and systems according to the present invention.
Figure 9:
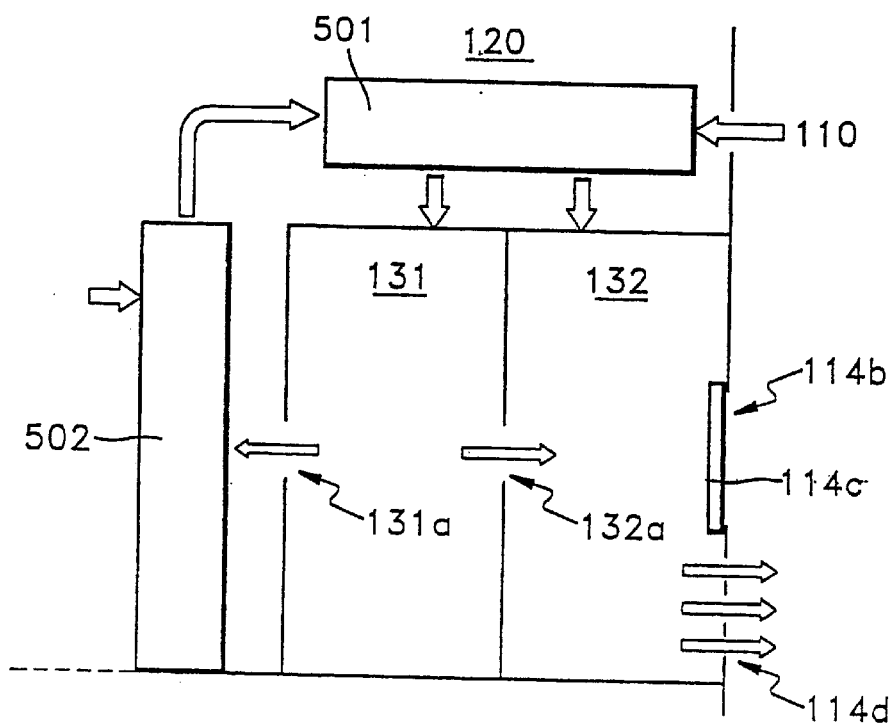
FIG. 9 illustrates a vertical structure of a microelectronic fabrication system according to a fifth embodiment of cleaning methods and systems according to the present invention.

FIGS. 8 and 9 show air-supplying means divided into two air-supplying devices for supplying the clean air to the wafer process area 131 and to the wafer transfer area 132.

Referring to FIG. 8, a first air-supplying device 501 supplies the secondarily purified clean air to both the wafer process area 131 and the wafer transfer area 132. The first air-supplying device 501 sucks the clean air from the upper portion of the working area 110. In some cases, the first air-supplying device 501 may suck the clean air from the lower plenum 300 and/or from the service area 120 and may secondarily purity the same. A second air-supplying device 502 supplies the clean air only to the wafer process area 131 in which the highest degree of cleanness must be maintained. The second air-supplying device 502 may suck the clean air from the working area 110. In some cases, the second air-supplying device 502 may suck the clean air from the lower plenum 300 and/or from the service area 120 and may secondarily purity the same.

Referring to FIG. 9, the first air-supplying device 501 supplies the secondarily purified clean air to both the wafer process area 131 and the wafer transfer area 132. The first air-supplying device 501 sucks clean air from the upper portion of the working area 110. In some cases, the first air-supplying device 501 may absorb the clean air from the lower plenum 300 and/or from the service area 120 and may secondarily purify the same. A second air-supplying device 502 supplies the secondarily purified clean air to the first air-supplying device 501. The second air-supplying device 502 also sucks clean air from the working area 110. In some cases, the second air-supplying device 502 may suck clean air from the lower plenum 300 and/or from the service area 120 and may secondarily purify the same.

As shown in FIGS. 8 and 9, the clean air supplied to the wafer process area 131 flows separately to each of the service area 120 and the wafer transfer area 132, which are maintained at a relatively low pressure. Also, the air in the wafer transfer area 132 is exhausted to the working area 110 by an air-exhausting hole 114d.

FIGS. 8 and 9 show that the boat gate 114b is closed by a door 114c and that the clean air is exhausted through an air exhausting hole 114d in the lower portion thereof. A door is generally installed not only in the boat gate 114b but also in the wafer gate 132a. Openings allowing a flow of air may be provided in the door.

The air supply structure shown in FIGS. 8 and 9 may be used when sufficient secondarily purified clean air is not supplied by a single air-supplying device or when the pressure difference between the wafer process area 131 and the wafer transfer area 132 may not be increased to a desired level. Moreover, since the above-described air supply structure has a vibration distributing effect, it can be desirably used when the wafer process area 131 is a wafer exposure area which is very sensitive to vibration, and can be employed in microelectronic fabrication systems shown in FIGS. 5 through 7.

Figure 10:
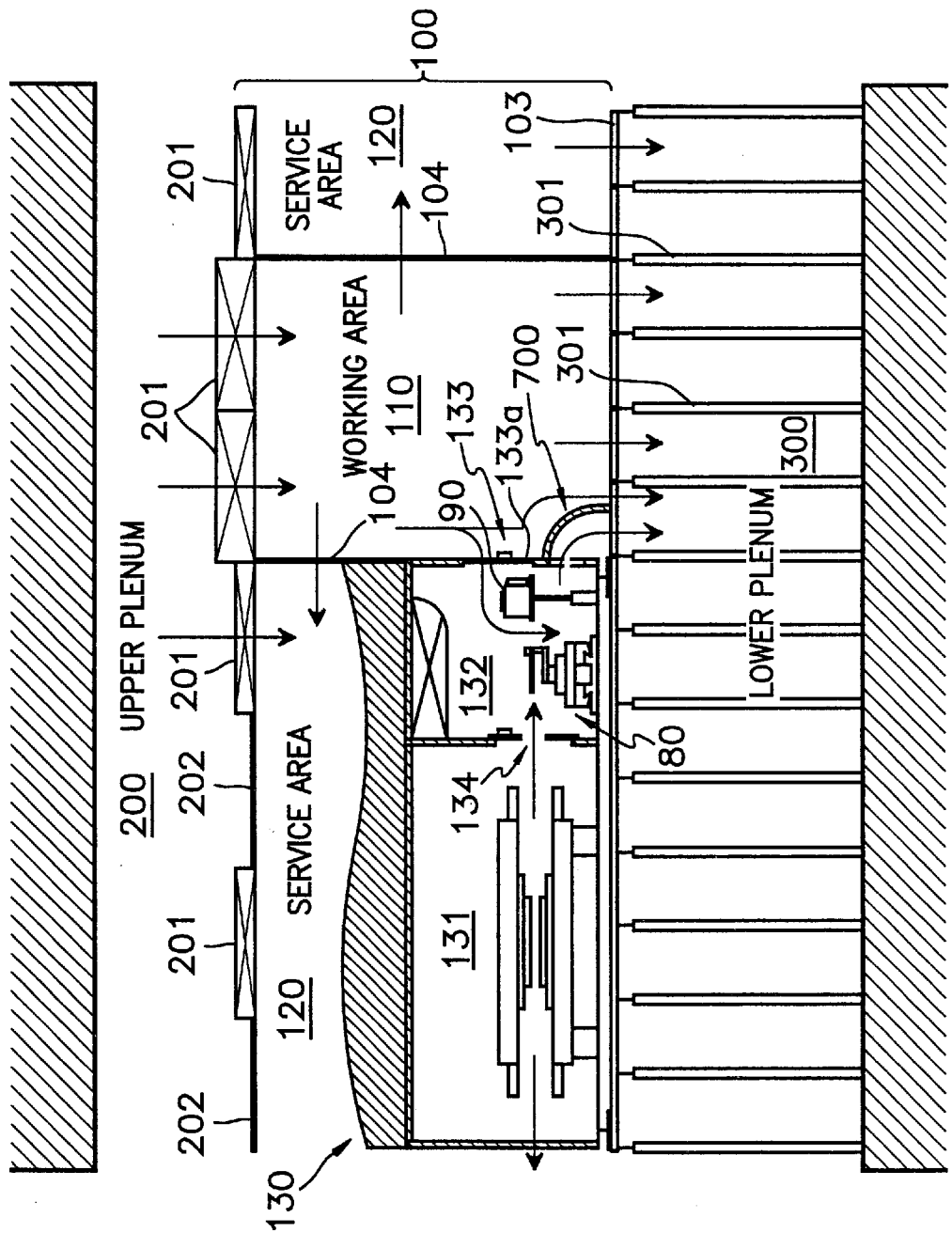
FIG. 10 is a schematic diagram illustrating a microelectronic exposure system having a clean air flow structure as shown FIG. 7.

FIG. 10 is schematic diagram illustrating a microelectronic exposure system having a clean air flow structure such as that shown in FIG. 7.

Referring to FIG. 10, an upper plenum 200 and a lower plenum 300 are positioned in the upper and lower portions of a clean room 100 partitioned into a working area 110 and a service area 120 by walls 104, respectively. A blind panel 202 having air filters 201 is provided between the clean room 100 and the upper plenum 200. A grating 103 corresponding to the bottom of the clean room 100 is supported by pillars 301 installed in the lower plenum 300.

An exposure apparatus 130 includes a wafer process area 131 and a wafer transfer area 132. The wafer transfer area 132 adjoins the working area 110. A boat gate 133 through which a boat 90 having wafers mounted thereon passes is provided between the wafer transfer area 132 and the working area 110 and a door 133a for opening/closing the boat gate 133 is installed therein. A robot 80, which unloads a wafer from the boat 90 and loads the wafer into the wafer process area 131 through the wafer gate 134, is installed in the wafer transfer area 132. The robot 80 performs a wafer loading operation and an unloading operation of returning the completed wafer to the boat 90 after processing.

In the wafer process area 131, exposure using a mask or reticle is performed. The reticle is generally supplied from a reticle stage to be described later.

An air-supplying device (not shown) supplies clean air to the wafer transfer area 132 and the wafer process area 131. The air-supplying device sucks clean air from the upper portion of the working area 110 close to the upper plenum 200, filters the sucked air physically and/or chemically and then supplies the filtered air to the wafer process area 131 and to the wafer transfer area 132. According to the present invention, a larger amount of the clean air is supplied to the wafer process area 131 so that the pressure of the wafer process area 131 is maintained higher than that of the wafer transfer area 132.

In the wafer transfer area 132, an air-exhausting path 700 as also shown in FIG. 7 directly connects the wafer transfer area 132 and the lower plenum 300. The air-exhausting path 700 provided in the lower portion of the wafer transfer area 132 is positioned close to a grating 103. As described above, the lower plenum 300 recovers the air having passed through the working area 110 and the service area 120 and is maintained at a very low pressure. Thus, since the wafer transfer area 132 that is maintained at a lower pressure than the wafer process area 131 and at a considerably higher pressure than the lower plenum 300, is directly connected to the lower plenum 300, the air in the wafer transfer area 132 can flow quickly to the lower plenum 300.

Arrows shown in FIG. 10 indicate flow directions of the clean air in the clean room 100. The flow of clean air from the wafer process area 131 is induced to the service area 120 and the wafer transfer area 132 through openings present around the wafer process area 131, a wafer gate 134 and/or other openings. Clean air is induced to flow to the wafer transfer area 132, not only from the wafer process area 131 but also from the working area 110. The clean air induced to flow to the wafer transfer area 132 is exhausted to the lower plenum 300 that is maintained at a very low pressure, through the air exhausting path 700.

Therefore, the wafer process area 131 can maintain a desirably high degree of cleanness. Thus, contamination of the wafers due to particles in the wafer process area 131 can be reduced and preferably prevented. In other words, particles produced in the wafer transfer area 132 may be prevented from entering the wafer process area 131 by maintaining the pressure of the wafer process area 131 higher than that of the wafer transfer area 132. Particularly, the clean air in the wafer transfer area 132 where a lot of particles are produced may be directly exhausted to the lower plenum 300, without being induced to flow to the wafer process area 131 and to the working area 110, thereby reducing and preferably effectively preventing the contamination of the clean room 100 due to the particles produced in the wafer transfer area 132.

In the above-described microelectronic exposure apparatus, an air exhausting device as shown in FIG. 6 also may be provided between the wafer transfer area 132 and the working area 110.

Figure 11:
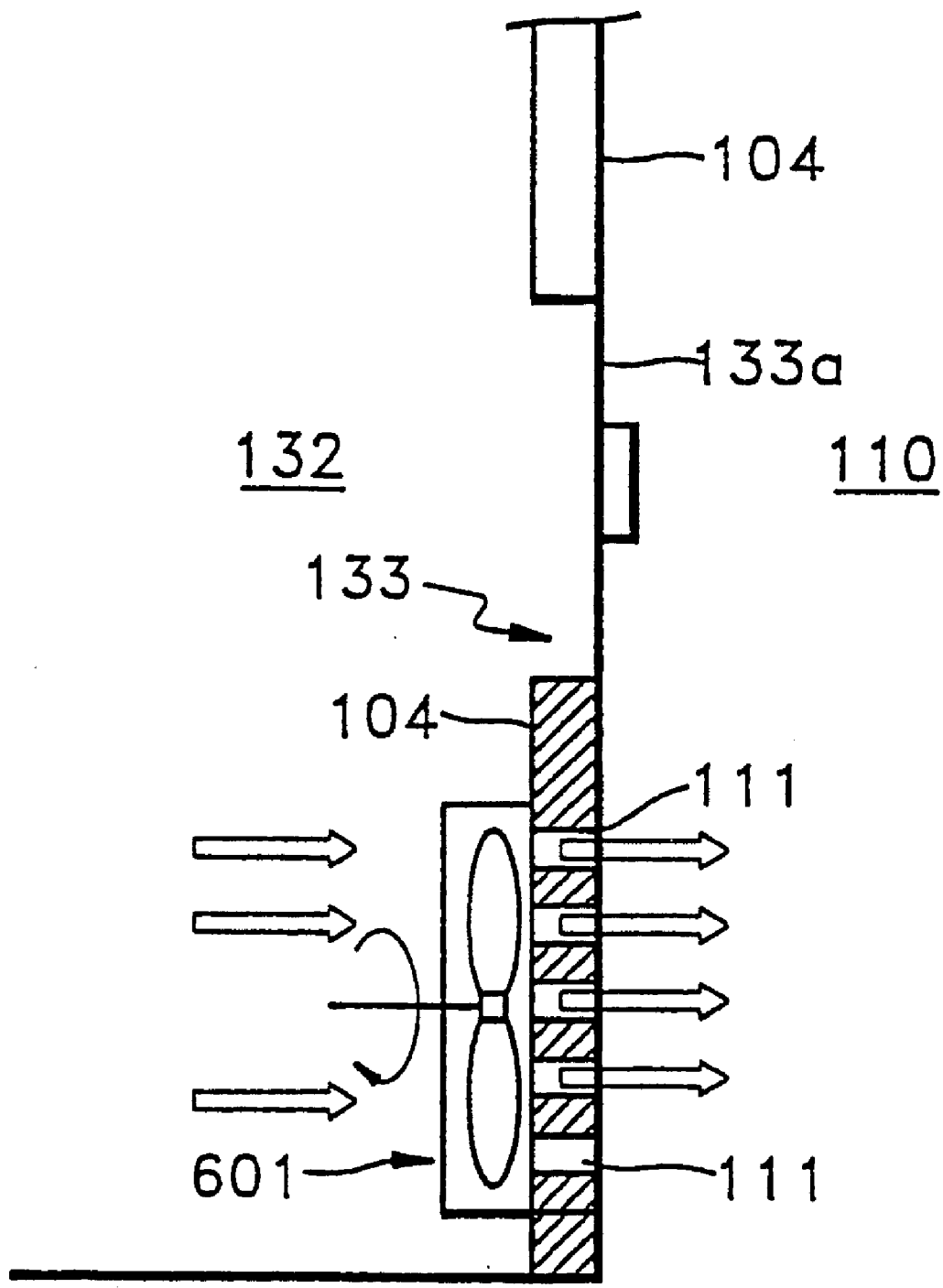
FIG. 11 illustrates an embodiment of a clean air exhaust device that is adapted to embodiments of microelectronic fabrication systems and methods according to the present invention.

Referring to FIG. 11, a boat gate 133 having a door 133a is provided in a wall 104 which isolates the wafer transfer area 132 from the working area 110, and a blower 601 is coupled to the inside lower portion thereof. A plurality of throughholes 111 for the flow of air are formed on the portion of the wall 104 facing the blower 601. The blower 601 forcibly exhausts the air in the wafer transfer area 132 and the particles contained therein to the working area 110.

Figure 12:
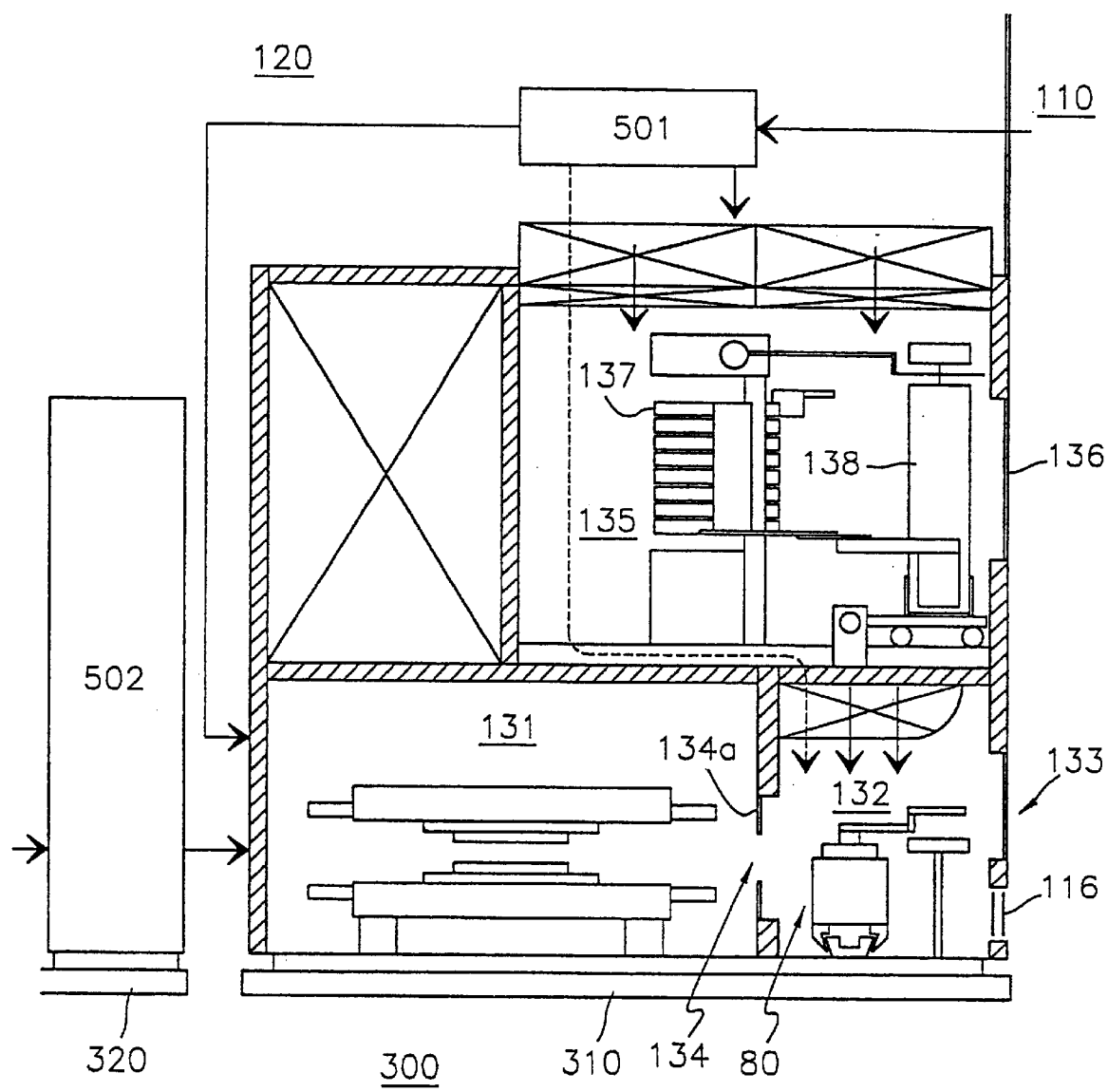
FIG. 12 illustrates a vertical structure of a first embodiment of an exposure apparatus that may be used with microelectronic fabrication systems and methods according to the present invention.
Figure 13:
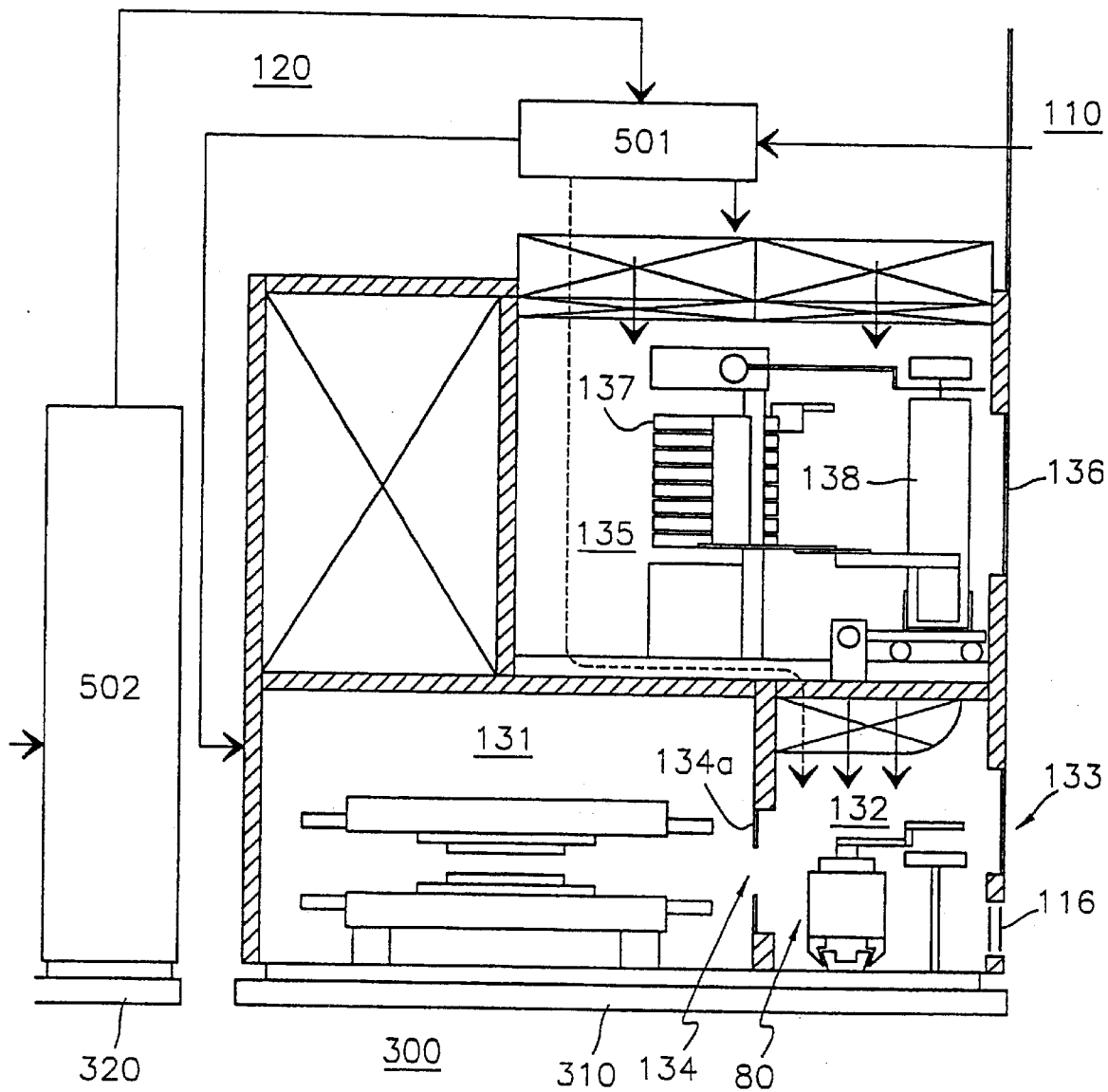
FIG. 13 illustrates a vertical structure of a second embodiment of an exposure apparatus that may be used with microelectronic fabrication systems and methods according to the present invention.

FIGS. 12 and 13 illustrate an overall structure of an exposure apparatus capable of employing two air-supplying devices as air supplying means.

Referring to FIG. 12, a wafer process area 131 and a wafer transfer area 132 are connected by a wafer gate 134 having a door 134a, and a reticle stage area 135 for supplying reticles or masks for exposure is provided thereabove. In the reticle stage area 135, a plurality of reticles 137 in the form of exposure films and a robot 138 for loading/unloading the reticles 137 to an exposure position are provided.

Clean air is supplied from a first air-supplying device 501 to the wafer process area 131, the wafer transfer area 132 and the reticle stage area 135. The first air-supplying device 501 that is spaced a predetermined distance apart from a second air-supplying device 502, receives air from the working area 110 and secondarily purifies the same therein physically and/or chemically. Since the exposure apparatus is sensitive to vibration, it preferably is installed on an independent anti-vibration base 310 spaced apart from a bottom member 320 of the second air-supplying device 502.

The second air-supplying device 502 adjoining the exposure apparatus, sucks clean air from the lower plenum 300 or the service area 120 and supplies clean air secondarily purified therein to the wafer process area 131.

According to the embodiment shown in FIG. 13, secondarily purified clean air is supplied from the second air-supplying, device 502 to the first air-supplying device 501. The first air-supplying device 501 supplies air to the wafer process area 131 the wafer transfer area 132 and the reticle stage area 135. It is preferred that the first air-supplying device 501 has a physicochemical air purifying function and the second air-supplying device 502 has a physical air purifying function.

As shown in FIGS. 12 and 13, an air flow path 116 allowing a flow of air is provided between the wafer transfer area 132 and the working area 110 so as to be close to the lower plenum 300. Thus, in order to exhaust the air in the wafer transfer area 132 to the working area 110 through the air flow path 116, the pressure of the wafer transfer area 132 should be higher than that of the working area 110. Also, the pressure of the wafer process area 131 should be higher than that of the wafer transfer area 132. Also, since a robot 138, which is a particle-generating source, is provided in the reticle stage area 135, it is desirable to exhaust the particles to the working area 110. To this end, it is preferred that the air in the wafer stage area 135 is exhausted to the working area 110 through gaps present around a reticle door 136 and/or other openings, such that the pressure of the wafer stage area 135 is maintained to be higher than that of the working area 110.

The pressure difference between the respective areas can be controlled by adjusting the amount of air supplied by the first and second air-supplying devices 501 and 502, as described above.

The number of particles attached to a conventional exposure apparatus and to an exposure apparatus having the aforementioned structure according to the present invention, in particular inside the wafer process area 131, were examined by experiments conducted under actual processing conditions. The results shown in Table 1 were obtained.

TABLE 1

|  | Sample 1 | Sample 2 | Sample 3 | Sample 4 |
|---|---|---|---|---|
| Conventional exposure apparatus | 53 | 25 | 38 | 29 |
| Exposure apparatus according to the present invention | 0 | 0 | 1 | 0 |

In Table 1 numbers indicate particles having sizes of 0.1 $\mu$m or greater attached to the respective 5-inch sample wafers. The experimental results indicated severe contamination of wafers due to a backward flow of air from the wafer transfer area to the wafer process area in a conventional exposure apparatus. However, heretofore, the backward flow of air does not appear to have been studied. No contamination or minimal contamination was indicated for an exposure apparatus according to the invention.

Figure 14:
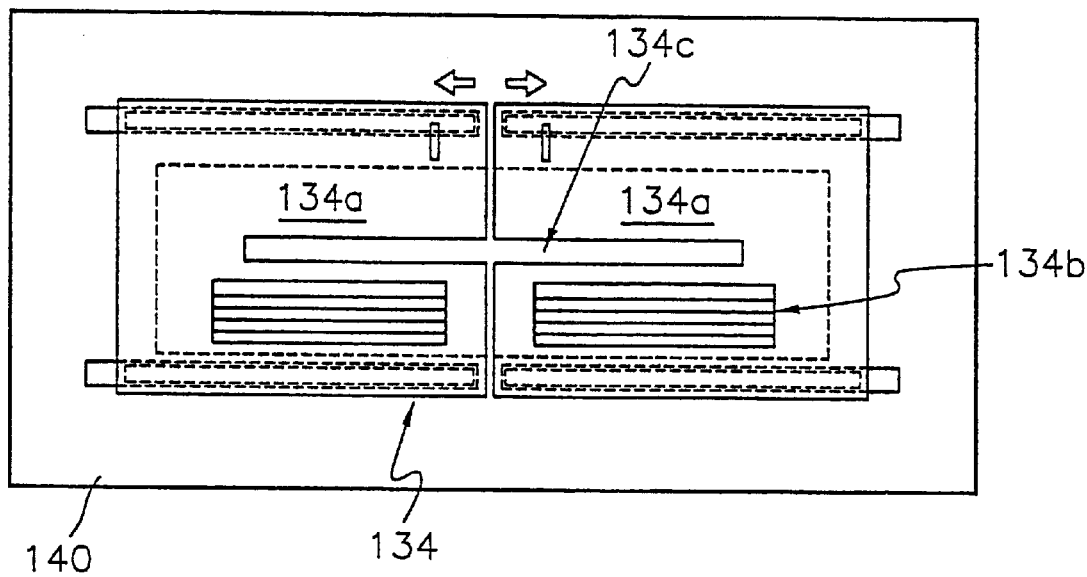
FIG. 14 is a front view of a wafer gate that may be used with embodiments of microelectronic fabrication systems and methods according to the present invention.
Figure 15:
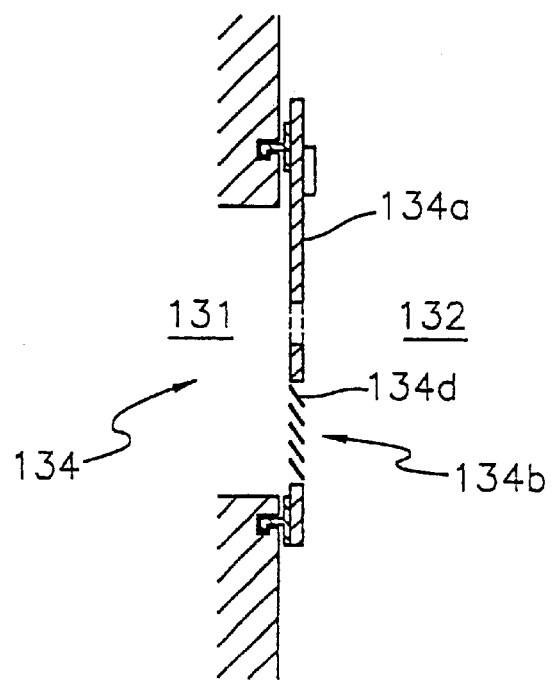
FIG. 15 is a side sectional view of a wafer gate shown in FIG. 14.

FIG. 14 is a front view of the door 134a that can facilitate a smooth flow of air between the wafer process area and the wafer transfer area and for effectively shielding external light, in the exposure system shown in FIGS. 12 and 13. FIG. 15 is a side view of FIG. 14.

Referring to FIGS. 14 and 15, a wafer gate 134 is provided in a wall 140 which isolates a wafer process area 131 from a wafer transfer area 132, and a set of doors 134a for opening/closing the wafer gate 134 are installed therein. A slit 134c is formed in the doors 134a. A louver 134b is installed in the lower portion of each of the doors 134a. The louver 134b is constructed such that a plurality of slats 134d, tilted at a predetermined angle with respect to the plane of the door 134a, are arranged in parallel. According to such construction, air flow is allowed in an oblique direction from the wafer process area 131 to the lower portion of the wafer transfer area 132 and the light from the wafer transfer area 132 may be shielded.

Figure 16:
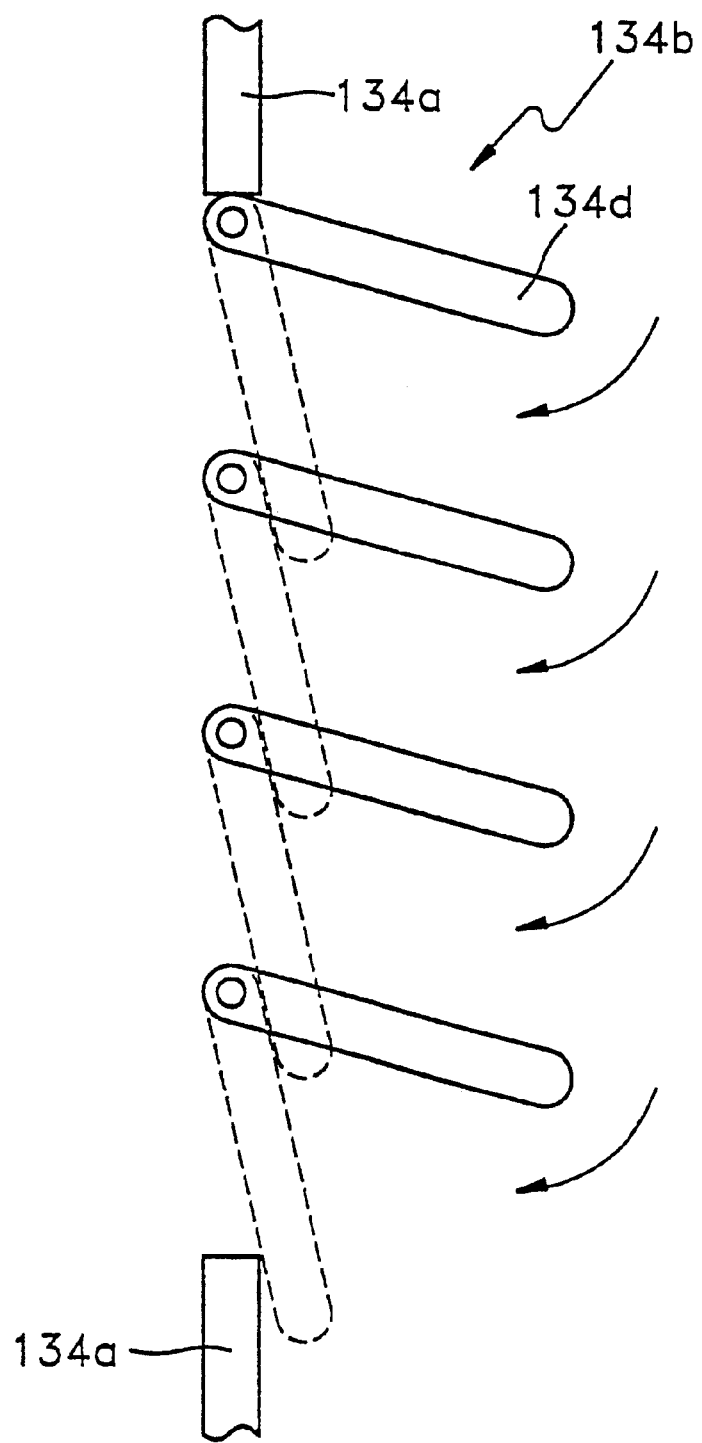
FIG. 16 is a side view of a louver of a wafer gate shown in FIG. 14.

As shown in FIG. 16, a rotary shaft is provided in the slats 134d and is rotatably supported by the door so that the air flow can be allowed or prohibited according to the rotation direction of the slats 134d.

Figure 17:
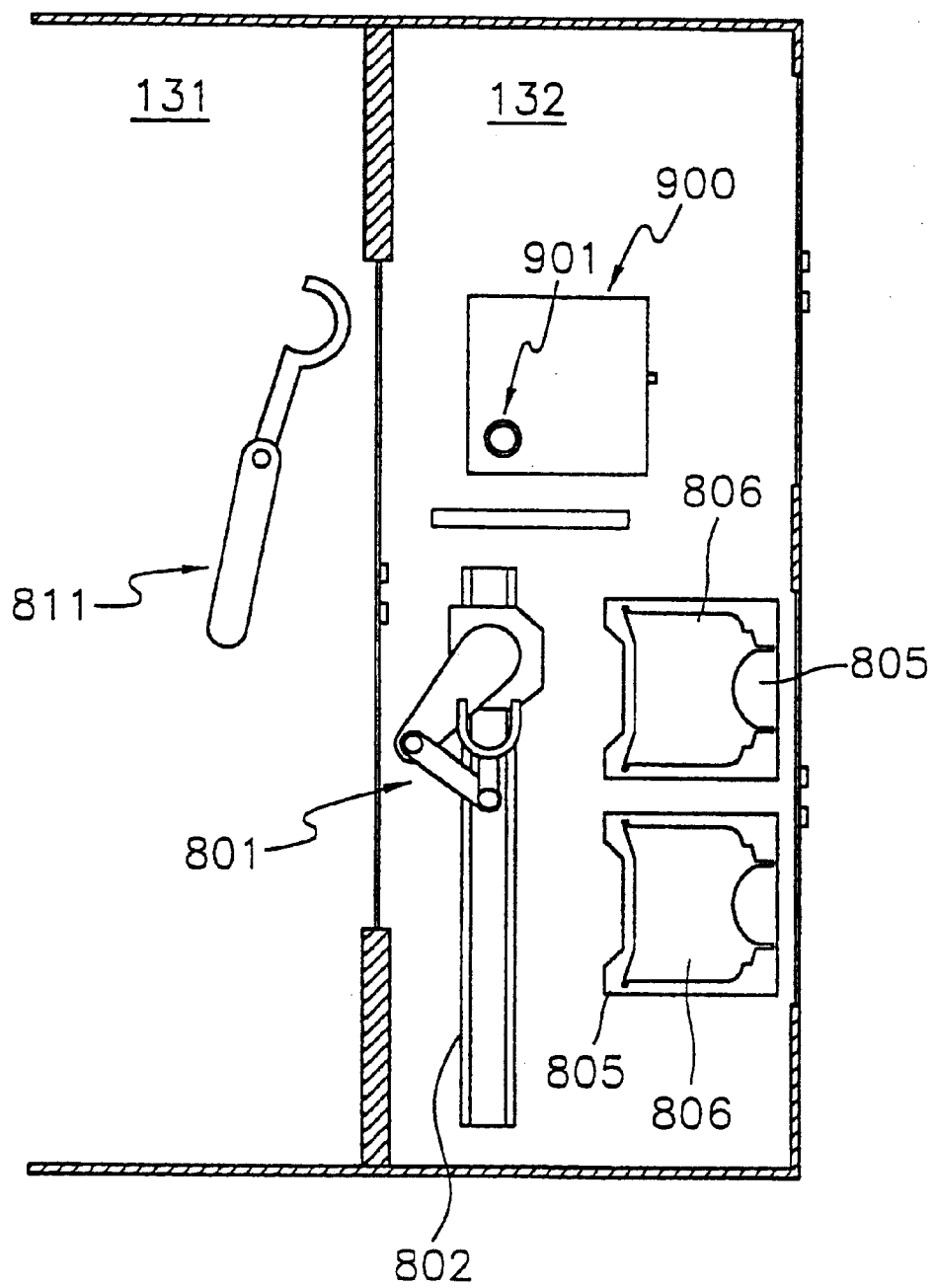
FIG. 17 illustrates a vertical structure of a third embodiment of an exposure apparatus that may be used with microelectronic fabrication systems and methods according to the present invention.

FIG. 17 shows an exposure apparatus having a structure that preferably can maximally suppress the generation of particles in the wafer transfer area 132.

As shown in FIG. 17, a boat stage 805 on which a boat 806 having wafers mounted thereon is seated, is provided in the wafer transfer area 132. A wafer lifter 900 and a first wafer transfer robot 801 are positioned in the vicinity of the boat stage 805. The first wafer transfer robot 801 is installed on a rail 802 and reciprocates along the rail 802. The first wafer transfer robot 801 installed in the vicinity of the wafer lifter 900 transfers wafers from the boat 806 to a seating portion 901 of the wafer lifter 900 and vice versa. A second wafer transfer robot 811 for transferring wafers positioned in the seating portion of the wafer lifter 900 to a wafer stage area 131 and vice versa is positioned in the wafer stage area 131.

Figure 18:
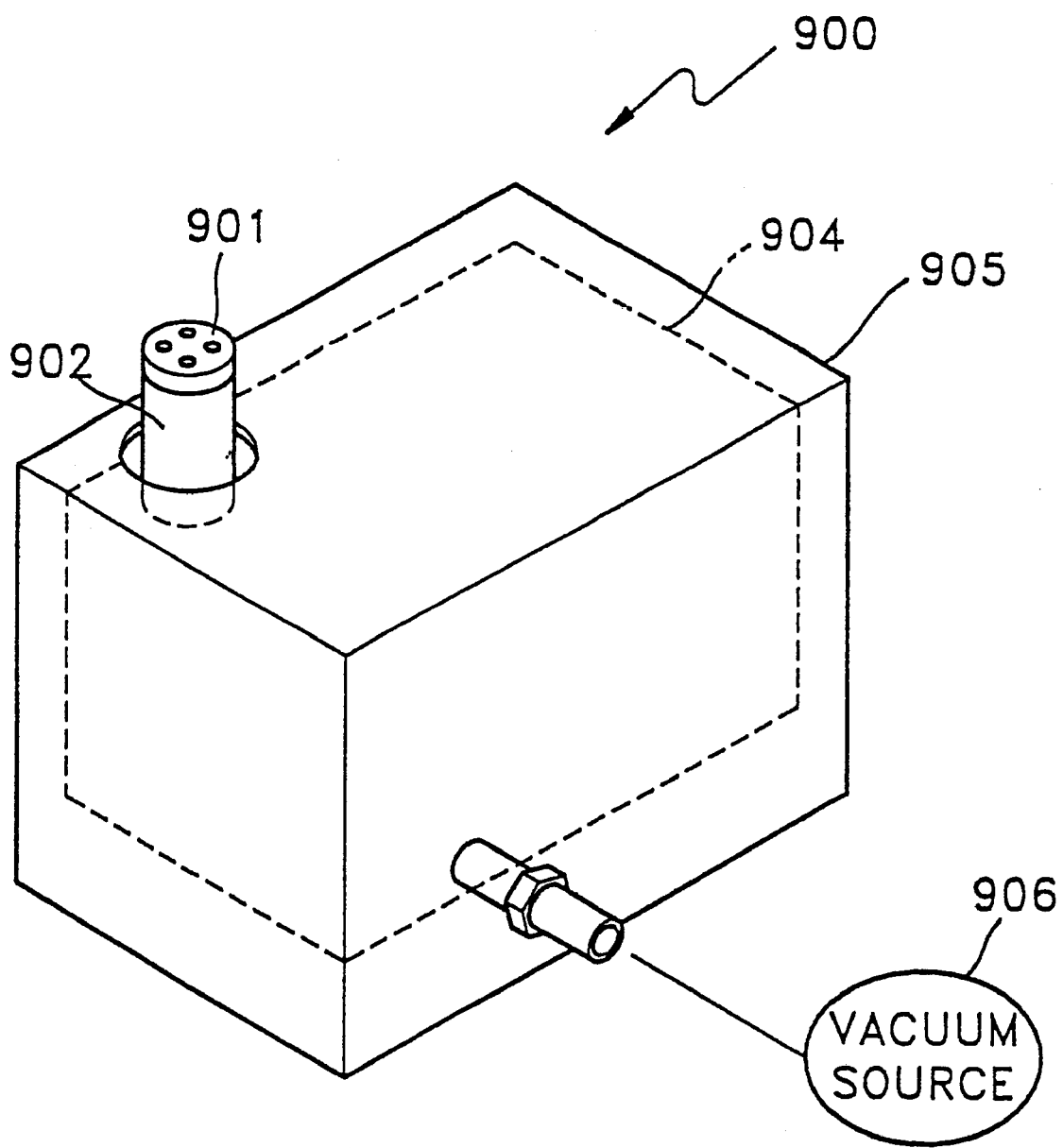
FIG. 18 is a perspective view of a wafer lifter in the exposure apparatus shown in FIG. 17 that may be used with microelectronic fabrication systems and methods according to the present invention.

The wafer lifter 900, as shown in FIG. 18, includes a lift 902 having a seating portion 901 where a wafer is seated on the top thereof and a body 904 for supplying power to the lift 902. The body 904 of the wafer lifter 900 is accommodated within a case 905 having a predetermined volume. The internal space of the case 905 is connected to a vacuum source 906 so that the particles produced in the body 904 of the wafer lifter 900 can be exhausted to the outside by the vacuum source 906.

Since the wafer lifter 900 having the aforementioned configuration is protected by the case 905, it is possible to reduce and preferably prevent the particles produced in the body 904 from entering the space of the wafer transfer area 132.

As described above, the pressure of a wafer process area where a predetermined process is performed on a wafer is maintained higher than that of a wafer transfer area so as to reduce and preferably prevent air from flowing in a backward direction from the wafer transfer area to the wafer process area. The pressure difference between the respective areas which should be maintained to reduce and preferably prevent the backward flow of air can be controlled by adjusting the amount of clean air supplied to the respective areas. Preferably, clean air in the wafer transfer area having a pressure lower than that of the wafer process area is exhausted to a working area or to a lower plenum, which can prevent air from staying in the wafer transfer area and can reduce the accumulation of particles due to the lack of movement of air.

Microelectronic fabrication system cleaning methods according to the present invention and microelectronic fabrication systems using the same can be applied to many systems that are used to fabricate microelectronic devices in addition to an exposure apparatus. According to the present invention, as shown in Table 1, the particles attached to a wafer can be reduced, preferably minimized and more preferably eliminated, thereby enhancing the yield of microelectronic devices.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of cleaning a microelectronic fabrication system that includes a service area, a process area in the service area where microelectronic devices are processed, a transfer area in the service area where the microelectronic devices are transferred to and from the process area, and a working area that is coupled to the service area, wherein the transfer area is also coupled to the working area, the cleaning method comprising the step of:

maintaining higher air pressure in the process area than in the transfer area to thereby reduce particle flow from the transfer area to the process area; and exhausting air from the transfer area to the working area to thereby enhance particle flow from the transfer area to the working area.

2. A method according to claim 1 further comprising the step of:

maintaining higher air pressure in the transfer area than in the working area to thereby enhance particle flow from the transfer area to the working area.

3. A method according to claim 1 further comprising the step of:

maintaining higher air pressure in the process area than in the service area outside the process area to thereby enhance particle flow from the process area to the service area outside the process area.

4. A method according to claim 2 further comprising the step of:
maintaining higher air pressure in the process area than in the service area outside the process area to thereby enhance particle flow from the process area to the service area outside the process area.

5. A method according to claim 1 wherein the maintaining step comprises the step of:
inducing air flow from the working area into the transfer area and into the process area to maintain higher air pressure in the process area than in the transfer area.

6. A method according to claim 4 wherein the maintaining step comprises the step of:
inducing air flow from the working area into the transfer area and into the process area to maintain higher air pressure in the process area than in the transfer area.

7. A method according to claim 2 further comprising the step of:
maintaining higher air pressure in the working area than in the service area.

8. A method according to claim 7 wherein the microelectronic fabrication system further includes an upper plenum that is coupled to the working area and to the service area and a lower plenum that also is coupled to the working area and to the service area to induce air flow through the working area and through the service area from the upper plenum to the lower plenum, the step of maintaining higher air pressure in the working area than in the service area comprising the step of:
inducing more air flow from the upper plenum to the lower plenum in the working area than from the upper plenum to the lower plenum in the service area.

9. A method according to claim 1 wherein the microelectronic fabrication system further includes a working area that is coupled to the service area and wherein the microelectronic fabrication system further includes an upper plenum that is coupled to the working area and to the service area and a lower plenum that also is coupled to the working area and to the service area to induce air flow through the working area and through the service area from the upper plenum to the lower plenum, the method further comprising the step of:
exhausting air from the transfer area to the lower plenum to thereby enhance particle flow from the transfer area.

10. A microelectronic fabrication system comprising:
a service area;
a working area that is coupled to the service area;
a process area in the service area where microelectronic devices are processed;
a transfer area in the service area where the microelectronic devices are transferred to and from the process area, the transfer area being coupled to the working area;
means for maintaining higher air pressure in the process area than in the transfer area to thereby reduce particle flow from the transfer area to the process area; and
means for exhausting air from the transfer area to the working area to thereby enhance particle flow from the transfer area to the working area.

11. A system according to claim 10 further comprising:
means for maintaining higher air pressure in the transfer area than in the working area to thereby enhance particle flow from the transfer area to the working area.

12. A system according to claim 10 further comprising:
means for maintaining higher air pressure in the process area than in the service area outside the process area to thereby enhance particle flow from the process area to the service area outside the process area.

13. A system according to claim 11 further comprising:
means for maintaining higher air pressure in the process area than in the service area outside the process area to thereby enhance particle flow from the process area to the service area outside the process area.

14. A system according to claim 10 wherein the means for maintaining comprises means for inducing air flow from the working area into the transfer area and into the process area to maintain higher air pressure in the process area than in the transfer area.

15. A system according to claim 13 wherein the means for maintaining higher air pressure in the process area comprises means for inducing air flow from the working area into the transfer area and into the process area to maintain higher air pressure in the process area than in the transfer area.

16. A system according to claim 11 further comprising:
means for maintaining higher air pressure in the working area than in the service area.

17. A system according to claim 16 further comprising:
an upper plenum that is coupled to the working area and to the service area;
a lower plenum that also is coupled to the working area and to the service area to induce air flow through the working area and through the service area from the upper plenum to the lower plenum;
the means for maintaining higher air pressure in the working area than in the service area comprising means for inducing more air flow from the upper plenum to the lower plenum in the working area than from the upper plenum to the lower plenum in the service area.

18. A system according to claim 10 further comprising:
an upper plenum that is coupled to the working area and to the service area;
a lower plenum that also is coupled to the working area and to the service area to induce air flow through the working area and through the service area from the upper plenum to the lower plenum; and
means for exhausting air from the transfer area to the lower plenum to thereby enhance particle flow from the transfer area.

19. A cleaning system for a microelectronic fabrication system that includes a service area, a process area in the service area where microelectronic devices are processed, a transfer area in the service area where the microelectronic devices are transferred to and from the process area, and a working area that is coupled to the service area, wherein the transfer area is also coupled to the working area, the cleaning system comprising:
an air handling system that maintains higher air pressure in the process area than in the transfer area to thereby reduce particle flow from the transfer area to the process area, and exhausts air from the transfer area to the working area to thereby enhance particle flow from the transfer area to the working area.

20. A cleaning system according to claim 19 wherein the air handling system further maintains higher air pressure in the transfer area than in the working area to thereby enhance particle flow from the transfer area to the working area.

21. A cleaning system according to claim 19 wherein the air handling system further maintains higher air pressure in the process area than in the service area outside the process area to thereby enhance particle flow from the process area to the service area outside the process area.

22. A cleaning system according to claim 20 wherein the air handling system further maintains higher air pressure in the process area than in the service area outside the process area to thereby enhance particle flow from the process area to the service area outside the process area.

23. A cleaning system according to claim 19 wherein the air handling system further induces air flow from the working area into the transfer area and into the process area to maintain higher air pressure in the process area than in the transfer area.

24. A cleaning system according to claim 21 wherein the air handling system induces air flow from the working area into the transfer area and into the process area to maintain higher air pressure in the process area than in the transfer area.

25. A cleaning system according to claim 20 wherein the air handling system further maintains higher air pressure in the working area than in the service area.

26. A cleaning system according to claim 25 wherein the air handling system further includes an upper plenum that is coupled to the working area and to the service area and a lower plenum that also is coupled to the working area and to the service area to induce air flow through the working area and through the service area from the upper plenum to the lower plenum, the air handling system further inducing more air flow from the upper plenum to the lower plenum in the working area than from the upper plenum to the lower plenum in the service area.

27. A cleaning system according to claim 19 wherein the air handling system further includes an upper plenum that is coupled to the working area and to the service area and a lower plenum that also is coupled to the working area and to the service area to induce air flow through the working area and through the service area from the upper plenum to the lower plenum, the air handling system further exhausting air from the transfer area to the lower plenum to thereby enhance particle flow from the transfer area.

28. A method for cleaning a microelectronic fabrication system comprising the steps of:
    inducing a flow of clean air at a first pressure into a service area positioned between an upper plenum and a lower plenum by inducing the flow of clean air from the upper plenum to the lower plenum;
    inducing a flow of clean air at a second pressure higher than the first pressure into a working area positioned between the upper plenum and the lower plenum and adjoining the service area by inducing the flow of clean air from the upper plenum to the lower plenum;
    supplying clean air to a wafer transfer area positioned between the service area and the working area and connected to the working area, and to a wafer process area connected to the wafer transfer area, the pressure of the wafer process area being maintained higher than that of the wafer transfer area; and
    inducing a flow of clean air from the wafer transfer area to the working area or to the lower plenum.

29. A method according to claim 28, wherein the step of supplying clean air comprises the steps of:
    supplying the clean air from the lower plenum, the service area or the working area;
    secondarily purifying the supplied clean air; and
    supplying the secondarily purified clean air to the wafer process area and to the wafer transfer area, wherein more clean air is supplied to the wafer process area than to the wafer transfer area.

30. A method according to claim 28, wherein the step of supplying clean air comprises the steps of:
    first and second sucking steps for sucking the clean air through respective independent first and second paths; and
    first and second adjusting steps for adjusting the clean air sucked in the respective first and second sucking steps in physical and/or chemical manners.

31. A method according to claim 29, wherein the step of supplying clean air comprises the steps of:
    first and second sucking steps for sucking the clean air through respective independent first and second paths; and
    first and second adjusting steps for adjusting the clean air sucked in the respective first and second sucking steps in physical and/or chemical manners.

32. A method according to claim 30, wherein the air adjusted by the first adjusting step is supplied to both the wafer process area and the wafer transfer area and the air adjusted by the second adjusting step is supplied only to the wafer process area.

33. A method according to claim 31, wherein the air adjusted by the first adjusting step is supplied to both the wafer process area and the wafer transfer area and the air adjusted by the second adjusting step is supplied only to the wafer process area.

34. A method according to claim 30, wherein the air is adjusted in physical and chemical manners in the first adjusting step, the air is adjusted in a physical or chemical manner in the second adjusting step and the clean air adjusted in the second adjusting step are subjected to the first adjusting step through the first path.

35. A method according to claim 31, wherein the air is adjusted in physical and chemical manners in the first adjusting step, the air is adjusted in a physical or chemical manner in the second adjusting step and the clean air adjusted in the second adjusting step is subjected to the first adjusting step through the first path.

36. A method according to claim 28, wherein the pressure of the wafer transfer area is maintained higher than that of the working area so that clean air flows from the wafer transfer area to the working area due to a pressure difference therebetween.

37. A method according to claim 29, wherein the pressure of the wafer transfer area is maintained to be higher than that of the working area so that clean air flows from the wafer transfer area to the working area due to a pressure difference therebetween.

38. A method according to claim 28, wherein the wafer transfer area is directly connected to the lower plenum that is maintained at a lowest pressure so that clean air in the wafer transfer area is directly exhausted to the lower plenum due to a pressure difference between the wafer transfer area and the lower plenum.

39. A method according to claim 29, wherein the wafer transfer area is directly connected to the lower plenum that is maintained at a lowest pressure so that clean air in the wafer transfer area is directly exhausted to the lower plenum due to a pressure difference between the wafer transfer area and the lower plenum.

40. A method according to claim 28 further comprising the step of blowing air from the wafer transfer area to the working area so that clean air in the wafer transfer area is exhausted to the working area by the blowing step.

41. The method according to claim 29 further comprising the step of blowing air from the wafer transfer area to the working area so that clean air in the wafer transfer area is exhausted to the working area by the blowing step.

42. A microelectronic fabrication system comprising:
   a working area and a service area positioned between an upper plenum and a lower plenum;
   a wafer transfer area in the service area, adjacent the working area;
   a wafer process area adjacent the wafer transfer area;
   means for supplying clean air to the wafer process area and to the wafer transfer area, the pressure of the wafer process area being maintained higher than that of the wafer transfer area, the means for supplying comprising:
   a first air supplying device that supplies air to the wafer process area and the wafer transfer area; and
   a second air supplying device that supplies air only to the wafer process area.

43. A microelectronic fabrication system according to claim 42, wherein means for supplying supplies the air differentially to the wafer transfer area and to the wafer process area, and the pressure of the wafer transfer area is maintained higher than that of the working area.

44. A microelectronic fabrication system according to claim 42, wherein the wafer transfer area is connected to the lower plenum by an air flow path.

45. A microelectronic fabrication system according to claim 42, further comprising an air exhausting device between the wafer transfer area and the working area, to exhaust air from the wafer transfer area to the working area.

46. A microelectronic fabrication system comprising:
   a working area and a service area between an upper plenum and a lower plenum;
   a wafer transfer area in the service area adjacent the working area;
   a wafer stage area connected to the wafer transfer area, wherein exposure of a wafer is performed;
   a reticle stage area that supplies reticles used for the exposure performed on the wafer in the wafer stage area; and
   means for supplying clean air to the wafer stage area and to the wafer transfer area, the pressure of the wafer stage area being maintained higher than that of the wafer transfer area, and the pressure of the wafer transfer area being maintained higher than that of the working area.

47. A microelectronic fabrication system according to claim 46, further comprising a wafer gate between the wafer stage area and the wafer transfer area, and wherein wafers pass through the wafer gate, the wafer gate including a louver that shields incident light and that allows the flow of air.

48. A microelectronic fabrication system according to claim 46, wherein the means for supplying includes a first air supplying device that supplies air to the wafer process area and to the wafer transfer area, and a second air supplying device that supplies air only to the wafer process area.

49. A microelectronic fabrication system according to claim 47, wherein the means for supplying includes a first air supplying device that supplies air to the wafer process area and to the wafer transfer area, and a second air supplying device that supplies air only to the wafer process area.

50. A microelectronic fabrication system according to claim 46, wherein the wafer transfer area is connected to the lower plenum by an air flow path.

51. A microelectronic fabrication system according to claim 47, wherein the wafer transfer area is connected to the lower plenum by an air flow path.

52. A microelectronic fabrication system according to claim 46, further comprising:
   a boat stage in the wafer transfer area, to hold a boat having wafers mounted thereon;
   a wafer lifter adjacent the boat stage, the wafer lifter including a lift having a seating portion provided on the top thereof, wherein a wafer unloaded from the boat stage is seated on the seating portion, and a body that supplies power to the lift;
   a first wafer transfer robot adjacent the wafer lifter in the wafer transfer area, to transfer wafers between the boat and the seating portion of the wafer lifter; and
   a second wafer transfer robot adjacent the wafer stage area, to transfer wafers between the seating portion of the wafer lifter and the wafer stage area.

53. A microelectronic fabrication system according to claim 47, further comprising:
   a boat stage in the wafer transfer area, to hold a boat having wafers mounted thereon;
   a wafer lifter adjacent the boat stage, the wafer lifter including a lift having a seating portion provided on the top thereof, wherein a wafer unloaded from the boat stage is seated on the seating portion, and a body that supplies power to the lift;
   a first wafer transfer robot adjacent the wafer lifter in the wafer transfer area, to transfer wafers between the boat and the seating portion of the wafer lifter; and
   a second wafer transfer robot adjacent the wafer stage area, to transfer wafers between the seating portion of the wafer lifter and the wafer stage area.

54. A microelectronic fabrication system according to claim 52, wherein the body of the wafer lifter is enclosed within a case and wherein internal space of the case is connected to a vacuum source so that the particles produced in the body of the wafer lifter are exhausted by the vacuum source.

55. A microelectronic fabrication system according to claim 53, wherein the body of the wafer litter is enclosed within a case and wherein internal space of the case is connected to a vacuum source so that the particles produced in the body of the wafer lifter are exhausted by the vacuum source.

56. A microelectronic fabrication system according to claim 46, wherein the means for supplying supplies the air differentially to the wafer transfer area and to the wafer stage area, and the pressure of the wafer transfer area is maintained higher than that of the working area.

57. A microelectronic fabrication system according to claim 46, further comprising an air exhausting device between the wafer transfer area and the working area, to exhaust the air from the wafer transfer area to the working area.

58. A microelectronic fabrication system comprising:
   a working area and a service area positioned between an upper plenum and a lower plenum;
   a wafer transfer area in the service area, adjacent the working area;
   a wafer process area adjacent the wafer transfer area;
   means for supplying clean air to the wafer process area and to the wafer transfer area, the pressure of the wafer process area being maintained higher than that of the wafer transfer area, the means for supplying comprising:
   a first air supplying device that supplies air to the wafer process area and the wafer transfer area; and a second air supplying device that supplies air to the first air supplying device.

59. A microelectronic fabrication system according to claim 58, wherein the means for supplying supplies the air differentially to the wafer transfer area and to the wafer process area, and the pressure of the wafer transfer area is maintained higher than that of the working area.

60. A microelectronic fabrication system according to claim 58, further comprising an air exhausting device between the wafer transfer area and the working area, to exhaust air from the wafer transfer area to the working area.

61. A microelectronic fabrication system comprising:
a working area and a service area positioned between an upper plenum and a lower plenum;
a wafer transfer area in the service area, adjacent the working area;
an air exhausting device between the wafer transfer area and the working area, to exhaust air from the wafer transfer area to the working area;
a wafer process area adjacent the wafer transfer area; and
means for supplying clean air to the wafer process area and to the wafer transfer area, the pressure of the wafer process area being maintained higher than that of the wafer transfer area.

62. A microelectronic fabrication system according to claim 61, wherein the means for supplying supplies the air differentially to the wafer transfer area and to the wafer process area, and the pressure of the wafer transfer area is maintained higher than that of the working area.

63. A method of cleaning a microelectronic fabrication system that includes a service area, a process area in the service area where microelectronic devices are processed, a transfer area in the service area where the microelectronic devices are transferred to and from the process area, a working area that is coupled to the service area, wherein the transfer area is also coupled to the working area, an upper plenum that is coupled to the working area and to the service area, and a lower plenum that also is coupled to the working area and to the service area to induce air flow through the working area and through the service area from the upper plenum to the lower plenum, the cleaning method comprising the steps of:
maintaining higher air pressure in the process area than in the transfer area to thereby reduce particle flow from the transfer area to the process;
maintaining higher air pressure in the transfer area than in the working area to thereby enhance particle flow from the transfer area to the working area;
maintaining higher air pressure in the working area than in the service area; and
inducing more air flow from the upper plenum to the lower plenum in the working area than from the upper plenum to the lower plenum in the service area.

64. A method of cleaning a microelectronic fabrication system that includes a service area, a process area in the service area where microelectronic devices are processed, a transfer area in the service area where the microelectronic devices are transferred to and from the process area, an upper plenum that is coupled to the working area and to the service area, and a lower plenum that also is coupled to the working area and to the service area to induce air flow through the working area and through the service area from the upper plenum to the lower plenum, the cleaning method comprising the steps of:
maintaining higher air pressure in the process area than in the transfer area to thereby reduce particle flow from the transfer area to the process area; and
exhausting air from the transfer area to the working area to thereby enhance particle flow from the transfer area to the working area.

65. A microelectronic fabrication system comprising:
a service area;
a process area in the service area where microelectronic devices are processed;
a transfer area in the service area where the microelectronic devices are transferred to and from the process area;
means for maintaining higher air pressure in the process area than in the transfer area to thereby reduce particle flow from the transfer area to the process area;
a working area that is coupled to the service area, and wherein the transfer area also is coupled to the working area;
means for maintaining higher air pressure in the transfer area than in the working area to thereby enhance particle flow from the transfer area to the working area;
means for maintaining higher air pressure in the working area than in the service area;
an upper plenum that is coupled to the working area and to the service area;
a lower plenum that also is coupled to the working area and to the service area to induce air flow through the working area and through the service area from the upper plenum to the lower plenum; and
the means for maintaining higher air pressure in the working area than in the service area comprising means for inducing more air flow from the upper plenum to the lower plenum in the working area than from the upper plenum to the lower plenum in the service area.

66. A microelectronic fabrication system comprising:
a service area;
a process area in the service area where microelectronic devices are processed;
a transfer area in the service area where the microelectronic devices are transferred to and from the process area;
means for maintaining higher air pressure in the process area than in the transfer area to thereby reduce particle flow from the transfer area to the process area;
a working area that is coupled to the service area;
an upper plenum that is coupled to the working area and to the service area;
a lower plenum that also is coupled to the working area and to the service area to induce air flow through the working area and through the service area from the upper plenum to the lower plenum; and
means for exhausting air from the transfer area to the lower plenum to thereby enhance particle flow from the transfer area.

67. A cleaning system for a microelectronic fabrication system that includes a service area, a process area in the service area where microelectronic devices are processed, a transfer area in the service area where microelectronic devices are transferred to and from the process area, a working area that is coupled to the service area, and wherein the transfer area also is coupled to the working area, the cleaning system comprising:
an air handling system that maintains higher air pressure in the process area than in the transfer area to thereby reduce particle flow from the transfer area to the process area, that maintains higher air pressure in the transfer area than in the working area to thereby enhance particle flow from the transfer area to the working area, that maintains higher air pressure in the working area than in the service area; and wherein the air handling system further includes an upper plenum that is coupled to the working area and to the service area and a lower plenum that also is coupled to the working area and to the service area to induce air flow through the working area and through the service area form the upper plenum to the lower plenum, the air handling system further inducing more air flow from the upper plenum to the lower plenum in the working area than from the upper plenum to the lower plenum in the service area.

68. A cleaning system for a microelectronic fabrication system that includes a service area, a working area that is coupled to the service area, a process area in the service area where microelectronic devices are processed, and a transfer area in the service area where microelectronic devices are transferred to and from the process area, the cleaning system comprising:

an air handling system that maintains higher air pressure in the process area than in the transfer area to thereby reduce particle flow from the transfer area to the process area; and wherein the air handling system further includes an upper plenum that is coupled to the working area and to the service area and a lower plenum that also is coupled to the working area and to the service area to induce air flow through the working area and through the service area from the upper plenum to the lower plenum, the air handling system further exhausting air from the transfer area to the lower plenum to thereby enhance particle flow from the transfer area.

69. A method of cleaning a microelectronic fabrication system that includes a service area, a process area in the service area where microelectronic devices are processed, a transfer area in the service area where the microelectronic devices are transferred to and from the process area, and a working area that is coupled to the service area, wherein the transfer area is also coupled to the working area, the cleaning method comprising the steps of:

maintaining higher air pressure in the process area than in the transfer area to thereby reduce particle flow from the transfer area to the process area; and maintaining higher air pressure in the transfer area than in the working area to thereby enhance particle flow from the transfer area to the working area.

70. A microelectronic fabrication system comprising:

a service area;

a working area that is coupled to the service area;

a process area in the service area where microelectronic devices are processed;

a transfer area in the service area where the microelectronic devices are transferred to and from the process area, the transfer area being coupled to the working area;

means for maintaining higher air pressure in the process area than in the transfer area to thereby reduce particle flow from the transfer area to the process area; and means for maintaining higher air pressure in the transfer area than in the working area to thereby enhance particle flow from the transfer area to the working area.

71. A cleaning system for a microelectronic fabrication system that includes a service area, a process area in the service area where microelectronic devices are processed, a transfer area in the service area where the microelectronic devices are transferred to and from the process area, and a working area that is coupled to the service area, wherein the transfer area is also coupled to the working area, the cleaning system comprising:

an air handling system that maintains higher air pressure in the process area than in the transfer area to thereby reduce particle flow from the transfer area to the process area, and maintains higher air pressure in the transfer area than in the working area to thereby enhance particle flow from the transfer area to the working area.

\* \* \* \* \*